United States Patent [19]

Fujisaki

[11] Patent Number: 5,734,660
[45] Date of Patent: Mar. 31, 1998

[54] SCAN TEST CIRCUIT FOR USE IN SEMICONDUCTOR INTEGRATED CIRCUIT

[75] Inventor: Kenichi Fujisaki, Machida, Japan

[73] Assignee: Motorola, Inc., Schaumburg, Ill.

[21] Appl. No.: 587,167

[22] Filed: Jan. 16, 1996

[30] Foreign Application Priority Data

Feb. 27, 1995 [JP] Japan ................... 7-038578

[51] Int. Cl.$^6$ ............................... G01R 31/28
[52] U.S. Cl. ......................... 371/22.3; 371/22.5
[58] Field of Search ..................... 371/22.3, 25.1, 371/27, 22.1, 22.5; 324/158 R, 73.1, 765; 365/201; 395/183.06

[56] References Cited

U.S. PATENT DOCUMENTS

| | | | |
|---|---|---|---|
| 4,476,560 | 10/1984 | Miller et al. | 371/15 |
| 4,855,669 | 8/1989 | Mahoney | 324/73 R |
| 4,864,579 | 9/1989 | Kishida et al. | 371/22.3 |
| 5,109,190 | 4/1992 | Sakashita et al. | 324/158 R |
| 5,477,493 | 12/1995 | Danbayashi | 365/201 |
| 5,519,714 | 5/1996 | Nakamura et al. | 371/22.3 |

Primary Examiner—Hoa T. Nguyen
Assistant Examiner—Nadeem Iqbal
Attorney, Agent, or Firm—Sharon K. Coleman

[57] ABSTRACT

An object of the present invention is to provide a scan test circuit for use in a semiconductor integrated circuit having a fewer package pins for scan tests.

Scan mode setting and input/output of scan-in and scan-out data are performed by a single-bit bi-directional scan message signal.

2 Claims, 7 Drawing Sheets

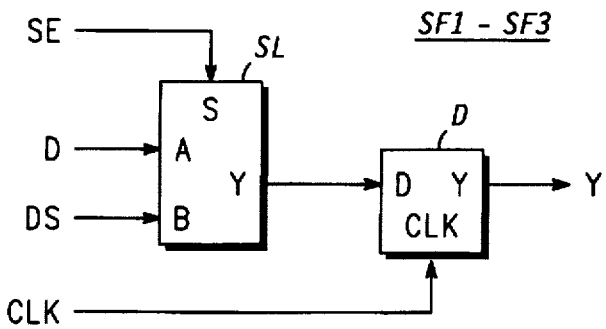
FIG. 3
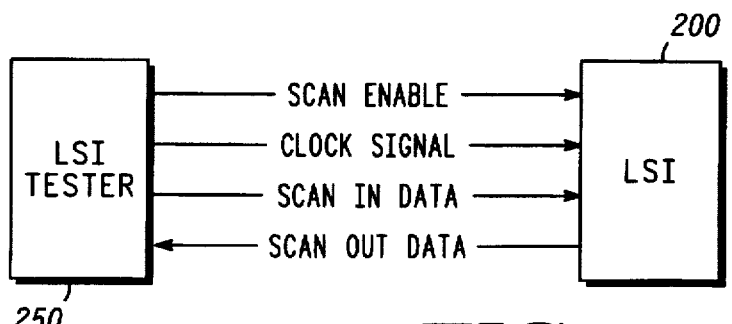
FIG. 4
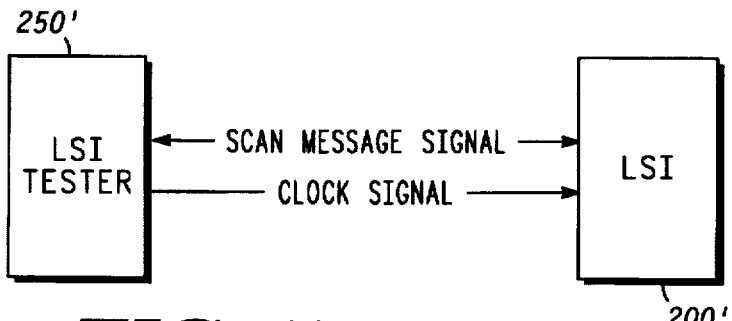
FIG. 5
FIG. 6
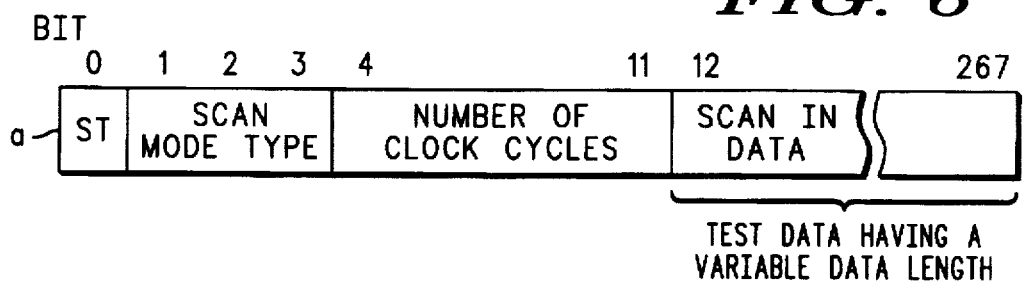

| SCAN MESSAGE BIT 1 2 3 | SCAN MODE TYPE | | MODE DEC 303 OUTPUT | | | |
|---|---|---|---|---|---|---|
| | SCAN MODE CONTENTS | ENABLE SIGNAL 1 | ENABLE SIGNAL 2 | ENABLE SIGNAL 3 | OUTPUT CONTROL SIGNAL |
| 0 0 0 | RUN MODE | 0 | 0 | 0 | 0 |
| 0 0 1 | BLOCK 101 SCAN IN MODE | 1 | 0 | 0 | 0 |
| 0 1 0 | BLOCK 101 SCAN OUT MODE | 1 | 0 | 0 | 1 |
| 0 1 1 | BLOCK 102 SCAN IN MODE | 0 | 1 | 0 | 0 |
| 1 0 0 | BLOCK 102 SCAN OUT MODE | 0 | 1 | 0 | 1 |
| 1 0 1 | BLOCK 103 SCAN IN MODE | 0 | 0 | 1 | 0 |
| 1 1 1 | BLOCK 103 SCAN OUT MODE | 0 | 0 | 1 | 1 |

*FIG. 10*

SCAN TEST CIRCUIT FOR USE IN SEMICONDUCTOR INTEGRATED CIRCUIT

FIELD OF THE INVENTION

The present invention relates to a scan test circuit for use in a semiconductor integrated circuit to simplify a failure analysis.

BACKGROUND OF THE INVENTION

Today, for LSI (large scale integrated circuit) and other semiconductor integrated circuit devices, design approach has been employed to simplify failure diagnostic tests conducted on their products before their shipment, such that a circuit for simplifying tests is incorporated into component circuits of semiconductor integrated circuit devices.

A scan-path design is one of such design techniques. With the scan-path design, all the memory elements (such as flip-flops) in the sequential circuit found in the component circuits of a semiconductor integrated circuit device are designed to form a series of linked shift registers, as far as their failure diagnostic tests are conducted. With the failure diagnostic tests based on the scan-path technique, bit shift operation of such shift registers is used to serially supply desired failure diagnostic test data to each of all the memory elements found in the component circuits of the semiconductor integrated circuit device. Furthermore, when the component circuits are actually operated in accordance with such test data, the contents stored and held in each of such memory elements are serially outputted using the bit shift operation of such shift registers. The bit shift routes of such shift registers are called scan paths.

FIG. 1 shows one example of circuit structure where the above scan-path design is applied to a circuit block comprised of D latches D1–D3 as shown in FIG. 2 and combinatory circuits 10 and 20.

In FIG. 1, each of the D latches D1–D3 shown in FIG. 2 are replaced by scan latches SF1SF3, each having an internal structure as shown in FIG. 3.

A scan latch shown in FIG. 3 is comprised of a selector SL and a D latch D; when a logic "0" signal is supplied to its input terminal SE, a signal supplied to its input terminal D is taken in according to the clock signal supply timing and then outputted from its output terminal Y, while it is held there; when a logic "1" signal is supplied to its input terminal SE, a signal supplied to its input terminal DS is taken in according to the clock signal supply timing, and then outputted from its output terminal Y, while it is held there.

Thus, in the configuration having such scan latches shown in FIG. 1, when a scan enable signal SEN is a logic value of "0", it functions similar to the circuit structure shown in FIG. 2; however, when the scan enable signal has a logic value of "1", the scan latches SF1, SF2 and SF3 each operate as a shift register linked together. Then, such a shift register forms a scan path such that test data is input serially from scan-in SIN, and the data stored in the scan latches SF1, SF2 and SF3 is output serially from scan-out SOUT.

Next, the procedure for a fault diagnostic test performed on the LSI having a circuit block with the scan-path design as described above is described.

FIG. 4 is an illustration showing the structure for performing such fault diagnostic tests.

It should be appreciated that in FIG. 4, the circuit blocks with the scan-path design as described in FIG. 1 have been formed in the LSI 200 subjected to the fault diagnostic tests.

In this case, each input and output signal to such circuit blocks are connected via package pins of the LSI 200 to the LSI tester 250.

With such structure, the LSI tester 250 supplies the fault diagnostic test data as scan data, together with a scan enable signal of a logic "1" value, to the LSI 200. In response to such operation, the fault diagnostic test data is supplied to the scan latches SF1, SF2, and SF3 within the circuit blocks in this order, while it is being shifted (Scan-In Mode).

Next, the LSI tester 250 supplies a scan enable signal of a logic "0" value to the circuit blocks. In response to such operation, the inherent circuit operation of the circuit block is implemented with the contents of the scan latches SF1, SF2, and SF3 that have been set in the above Scan-In Mode as its initial value (RUN Mode).

The LSI tester 250 then supplies a scan enable signal of a logic "1" value to the circuit block again. In response to such operation, the contents of the scan latches SF1–SF3 are outputted as scan-out, while they are being shifted sequentially in the order of SF3, SF2, and SF1, as a result of the RUN Mode operation (Scan-Out Mode).

Next, the LSI tester 250 compares the scan-out output data value with the expected value, and, if they mismatch, determines that the circuit block is faulty. It should be appreciated that the fault diagnostic test data and expected value have been generated in advance at the design phase of the circuit block.

As described above, by incorporating the scan-path design as shown in FIG. 1 into the circuit block as configured in FIG. 1, it is possible to supply the diagnostic test data directly to all the D-latches in the sequential circuit without using input signals $IN_1$ and $IN_2$ and giving consideration to the logic implementation of the combinatory circuit network 10. Furthermore, when the above circuit block is operated in accordance with such test data, the contents held in each D-latch may be directly monitored, without the combinatory circuit network 20 and output signal 0.

Because the sequential circuit may be subjected to fault testing by artificially considering it as a combinatory circuit, the generation of the fault diagnostic test data and fault diagnostic testing based thereon may be implemented easily.

However, when the afore-described scan-path scheme is employed, input and output pins for scan-in, scan enable, and scan-out must be provided in the LSI sorely for performance of the fault diagnostic testing. Because the total number of pins provided by the LSI itself is limited, there is, traditionally, a problem that if too many package pins are used by the component circuits that should be formed in the LSI, such scan test pins cannot be provided.

Especially with a semiconductor IC device, where multiple circuit blocks with the same function are formed redundantly and implemented with a scan design to permit individual fault analysis on each of such multiple circuit blocks, such that only circuit blocks that are determined as acceptable during fault diagnostic testing can be used selectively to increase its yield, it is necessary to provide scan-enable input pins corresponding in number to the circuit blocks, in addition to the scan-in and scan-out pins, so that the scan-path scheme cannot be adopted.

Accordingly, it is an object of the present invention to provide a scan test circuit for use in a semiconductor IC device, with a reduced number of package pins provided for scan testing.

SUMMARY OF THE INVENTION

A scan test circuit for use in a semiconductor integrated circuit device, comprising:

a circuit block having a scan latch for shifting a scan-in signal and holding said scan-in signal at each clock timing in response to an enable signal, said scan latch also shifting the held signal and reading out the held signal as scan-out at said clock timing in response to said enable signal, said scan test circuit further comprising:

scan message input and output means for receiving a scan message signal consisting of scan mode type information and scan-in data connected to each other in series, while issuing said scan-out as said scan message signal in response to an output control signal, said scan mode type information signal being operative to designate a scan mode, and said scan-in data serving as a fault diagnostic test data;

message separating means for separating said scan mode type information from said scan message signal, while separating said scan-in data as said scan-in signal from said scan message signal; and a mode decoder for supplying said enable signal to said circuit block when said scan mode type information is indicative of a scan-in mode, and for supplying said enable signal to said circuit block and supplying said output control signal to said scan message input and output means when said scan mode type information is indicative of a scan-out mode.

A scan message signal is input, which consists of Scan Mode Type information that designates a scan mode to be performed and the Scan-In Data, which serves as fault diagnostic test data, connected to each other in series, and the Scan Mode Type information and Scan-In Data are individually separated and extracted from the scan message signal. During this process, if the Scan Mode Type information is indicative of the scan-in mode, an enable signal is supplied to the relevant circuit block to permit the Scan-In Data to be held in the scan latches formed within that circuit block. On the other hand, if the Scan Mode Type information is indicative of the scan-out mode, an enable signal is supplied to the relevant circuit block to permit the content stored in each of the scan latches formed within that circuit block to be scanned out, which is then outputted as a scan message signal.

BRIEF DESCRIPTION OF THE DRAWINGS

FIG. 3 shows an internal structure of scan latches SF1–SF3.

FIG. 4 shows the structure for implementing prior art scan tests.

FIG. 5 shows the structure for implementing scan tests on LSI 200' having a scan test circuit according to the present invention.

FIG. 6 shows a signal format of a scan message signal.

FIG. 10 shows a truth table for Scan Mode Type and mode decoder 303.

DETAILED DESCRIPTION OF THE INVENTION

FIG. 5 is an illustration showing an LSI 200' having a scan test circuit according to the present invention, and an LSI tester 250' for performing fault diagnostic tests on the LSI 200'.

In FIG. 5, the LSI tester 250' supplies a scan test clock signal of a predetermined frequency to the LSI 200'. During this process, the LSI tester 250' and LSI 200' execute a scan test as a fault diagnostic test by use of a one-bit serial and bi-directional scan message signal.

FIG. 6 illustrates one example of a signal format for such a scan message signal.

In FIG. 6, a scan message signal a is a signal sent from the LSI tester 250' to the LSI 200'. A start bit ST of a logic "1" value indicative of a start position of the scan message signal a is assigned to a header bit 0 of the scan message bits in the scan message signal a. To scan message bits 1–3 are assigned the information indicative of whether the scan test mode to be performed is the scan-in mode, RUN mode, or scan-out mode, and the information that designates a circuit block that is subject to a scan-in or scan-out operation, as the Scan Mode Type. To scan message bits 4–11 are assigned the information that designates the number of clock cycles of the test clock signal to be supplied to the circuit block designated by the Scan Mode Type. To the scan message bits 12–267 are assigned the fault diagnostic test data to be supplied to the circuit block as Scan-In Data. It should be appreciated that the Scan-In Data is assigned within the bits 12–276 only when the scan test mode designated by the Scan Mode Type is indicative of the scan-in mode, and is variable in length.

A scan message signal b in FIG. 6 is a signal sent from the LSI 200' to the LSI tester 250'. The scan message signal b is indicative of the scan-out data serially transmitted from the circuit block of the LSI 200'. When the scan message signal a having the Scan Mode Type indicative of the scan-out mode is sent from the LSI tester 250', the scan message signal b is sent from the LSI 200' to the LSI tester 250' in response.

Figure 7:
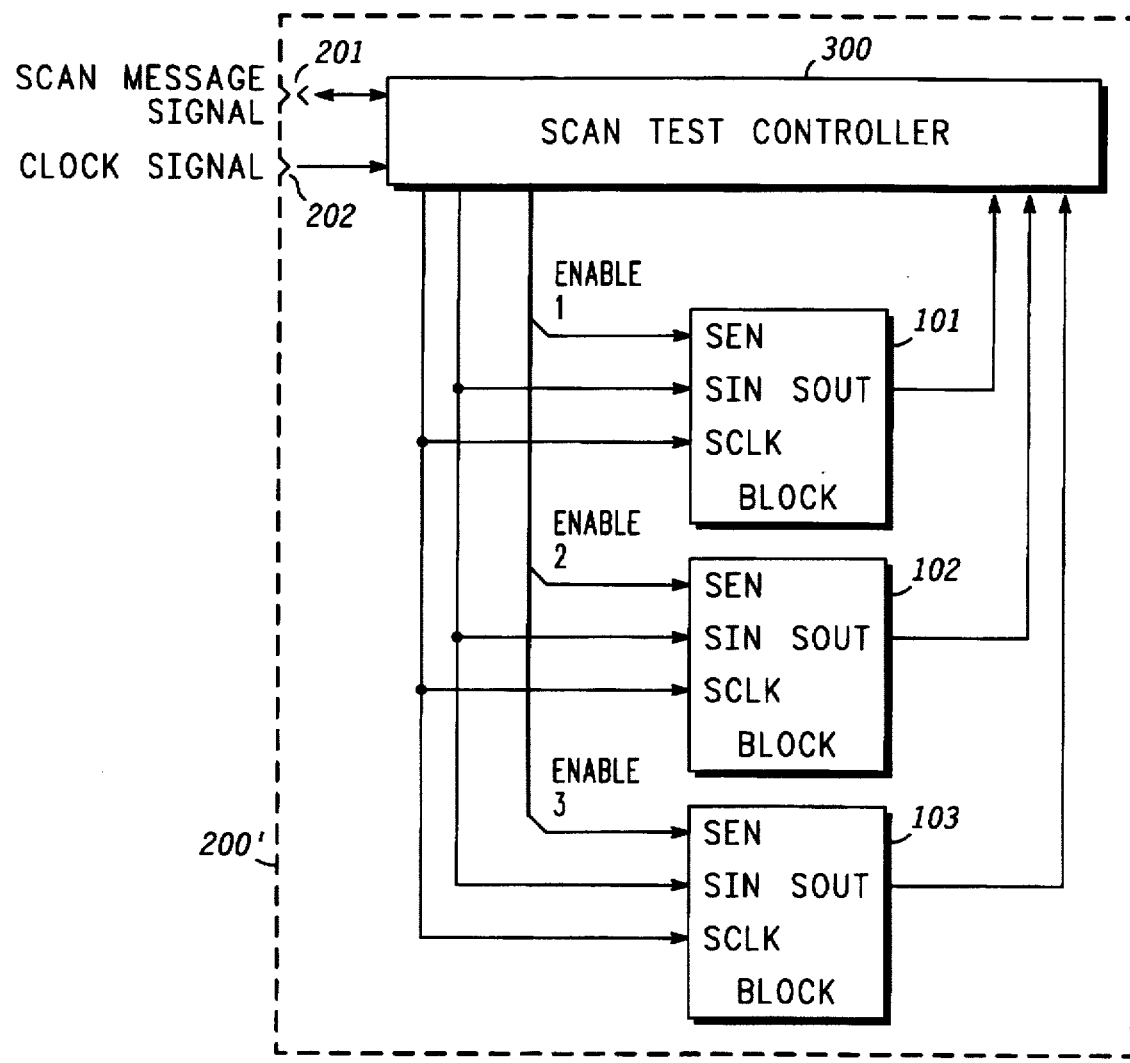
FIG. 7 shows the structure of LSI 200' having a scan test circuit according to the present invention.

FIG. 7 shows one example of internal structure of the LSI 200' having a scan test controller 300 as a scan test circuit according to the present invention.

Figure 1:
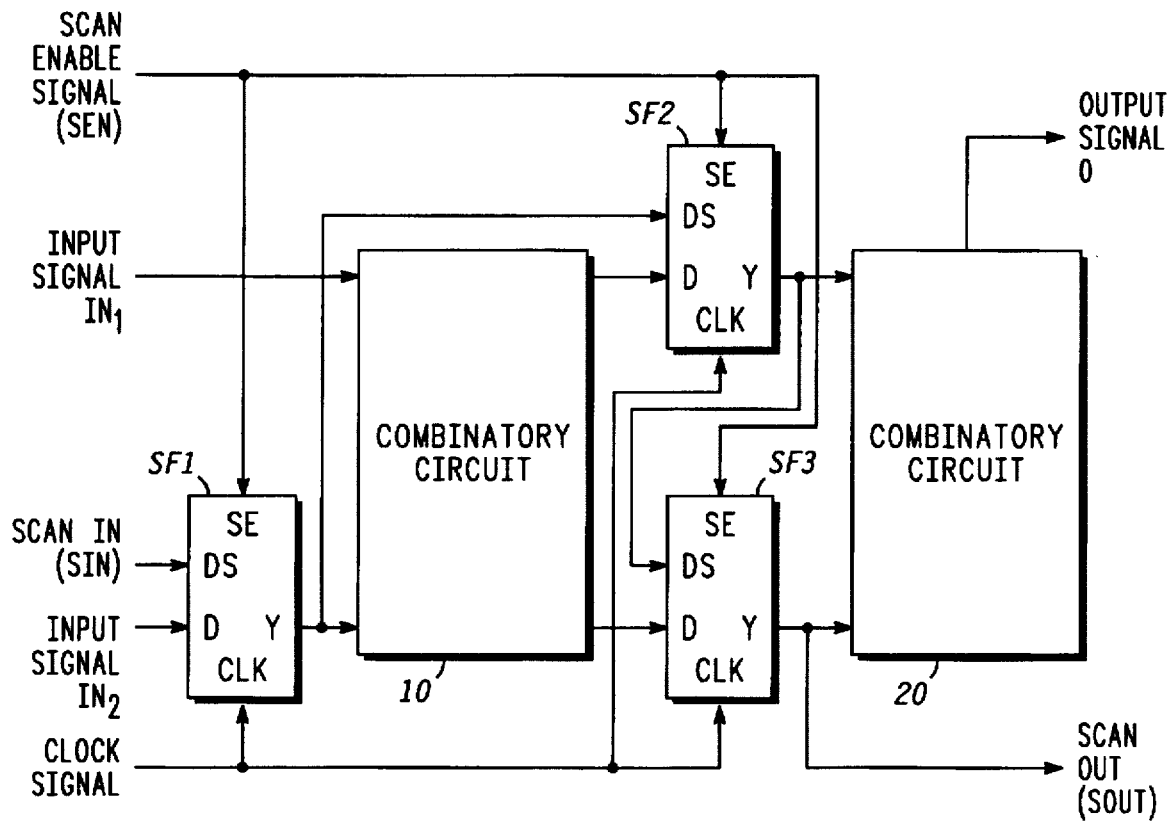
FIG. 1 shows one example of circuit structure to which scan-path design is applied.

In the LSI 200' shown in FIG. 7, three circuit blocks 101, 102, and 103 are present as its component circuits, and each of these circuit blocks is implemented with the scan-path design as shown in FIG. 1. In the embodiment shown in FIG. 7, only signal that control the scan test are described, where signals in and out of the circuit blocks 101, 102, and 103, as well as package pins that interface them externally to the LSI 200', are omitted. It should be appreciated that the input terminals SEN, SIN, and SCLK, and output terminal SOUT shown in these circuit blocks correspond to the scan enable signal, scan-in, scan test signal, and scan-out signal, respectively.

In FIG. 7, the scan message signal a supplied from the LSI tester 250', as shown in FIG. 6, is supplied serially to the scan test controller 300 via scan-test bi-directional package pin 201 of the LSI 200'. On the other hand, the scan message signal b outputted from the scan test controller 300, as shown in FIG. 6, is sent serially to the LSI tester 250' via the scan test bi-directional package pin 201. A scan test clock signal of a predetermined frequency supplied from the LSI tester 250' is provided to the scan test controller 300 via the package pin 202 of the LSI 200'.

Figure 8:
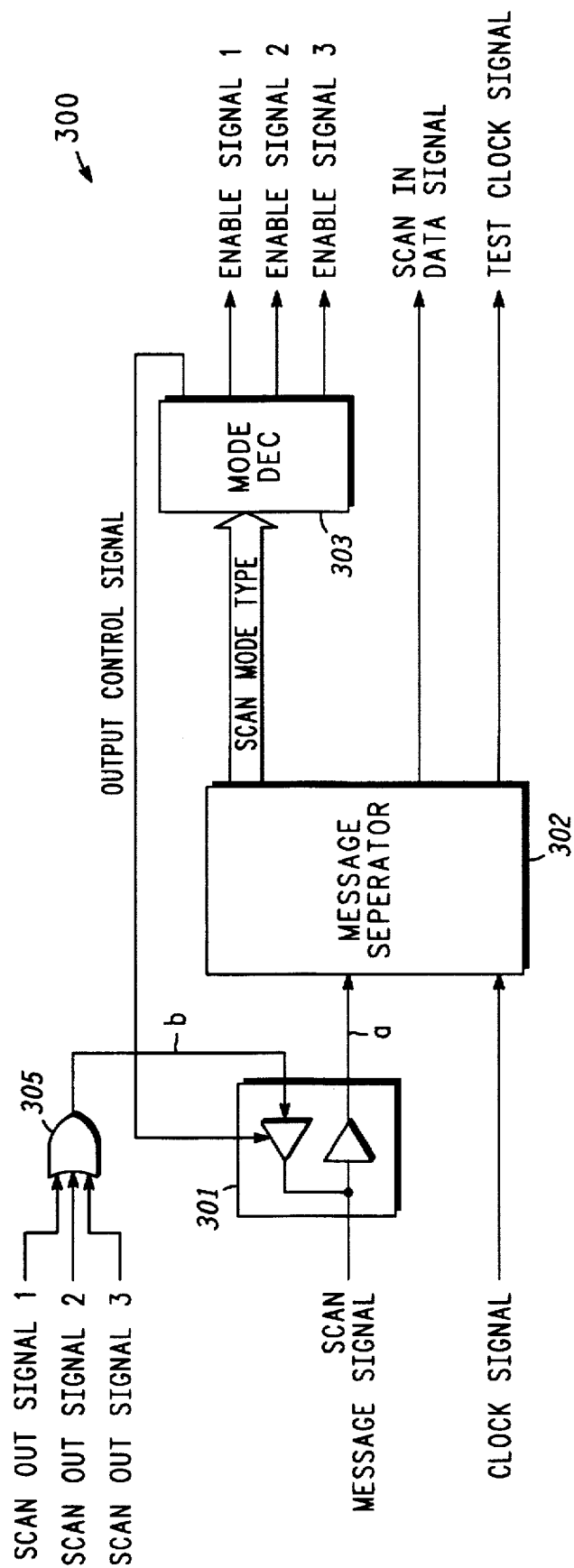
FIG. 8 shows the structure of a scan test controller 300 as the scan test circuit according to the present invention.

FIG. 8 shows one example of internal structure of such a scan test controller 300.

A bi-directional buffer 301 of the scan controller 301 provides the scan message signal a supplied serially via the scan test bi-directional package pin 201, as shown in FIG. 6, to a message separation circuit 302.

The message separation circuit 302 separates and extracts from the scan message signal a the Scan Mode Type information, the Number of Clock Cycles information, and Scan-In Data shown in FIG. 6. During this process, the message separation circuit 302 provides to the mode decoder 303 the Scan Mode Type information signal corresponding to the Scan Mode Type information separated. The message separation circuit 302 also provides the Scan-In Data signal corresponding to the separated Scan-In Data to the input terminal SIN of the respective circuit blocks 101–103 shown in FIG. 7, still in a serial manner. Furthermore, the message separation circuit 302 generates a test clock signal corresponding to the clock cycles designated by the Number of Clock Cycles information separated, and provides it to the input terminal SCLK of the respective circuit blocks 101–103.

Figure 9:
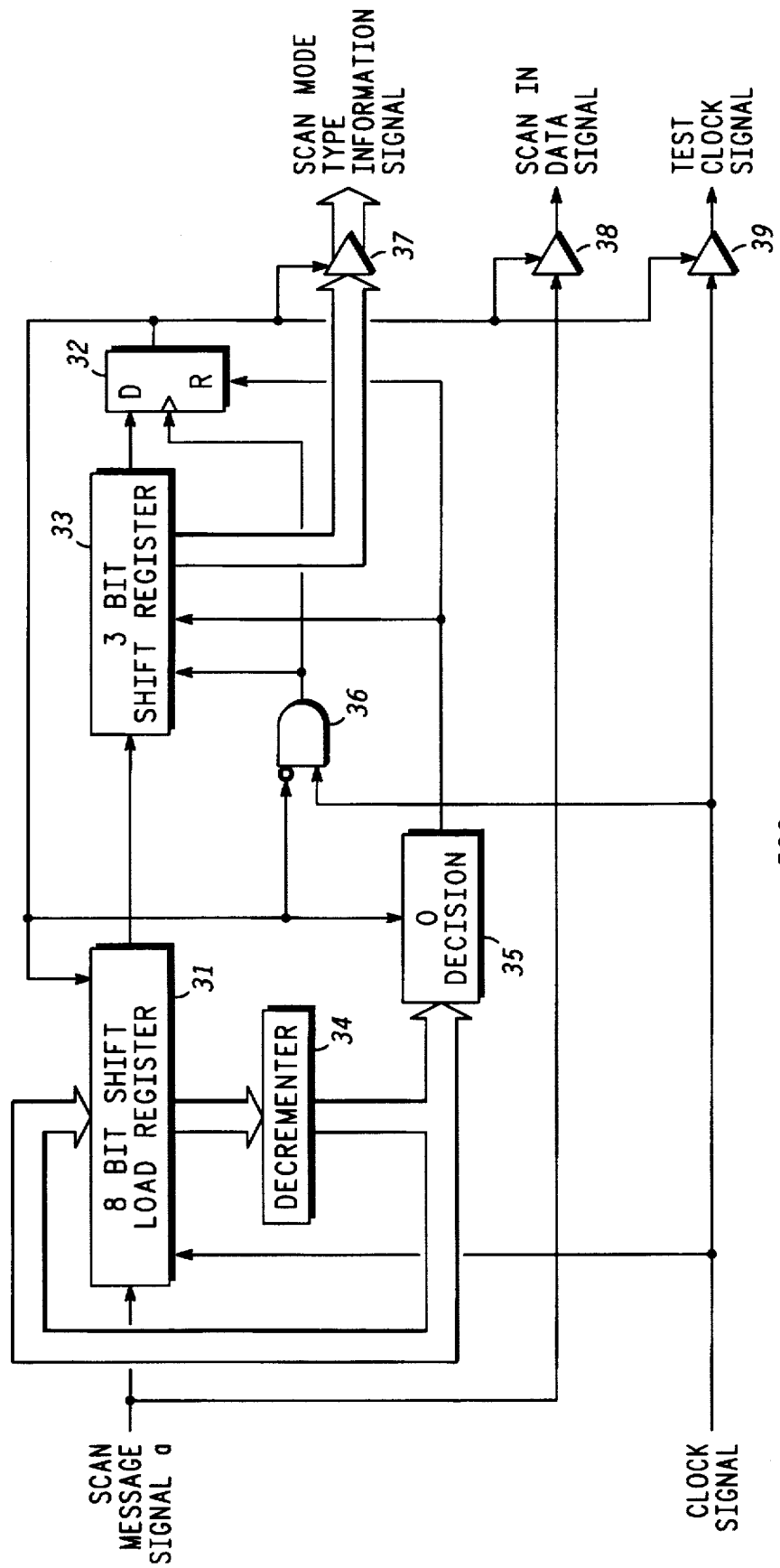
FIG. 9 shows one example of internal structure of a message separation circuit 302.

FIG. 9 shows one example of internal structure of the message separation circuit 302.

In FIG. 9, an 8-bit shift load register 31 functions as a 8-bit shift register when a signal of a logic "0" value is supplied from the D-flip-flop 32 described above; in this case, the scan message signal a is sequentially acquired at a timing of the clock signal, which is then serially supplied to the next-stage 3-bit shift register 33 while it is being shifted by 8 bits. On the other hand, the 8-bit shift load register 31 functions as a 8-bit load register when a signal of a logic "1" value is supplied from the D-flip-flop 32; in this case, 8 bits of a decrement data signal supplied from a decrementer, which will be described later, are acquired in parallel at a timing of the clock signal and provided to the decrementer 34.

The decrementer 34 decrements by 1 the value of the 8-bit data signal supplied from the 8-bit shift load register 31, and provides a decrement data signal corresponding to the decremented value to the 8-bit shift load register 31 and a zero-decision circuit 35.

More specifically, the structure comprised of the 8-bit shift load register 31 and decrementer 34 acts as an 8-bit shift register when a signal of a logic "0" value is supplied from the D-flip-flop 32, while it acts as a down-counter having as its initial value the 8-bit content eventually stored as a result of the shift register operation when a signal of a logic "1" value is supplied from the D-flip-flop 32.

Only when a signal of a logic "1" value is supplied from the D-flip-flop 32, the zero-decision circuit 35 determines whether the decrement data signal supplied from the decrementer 34 is zero or not; only when it is determined that the value of the decrement data signal is 0, it generates a reset pulse signal, which is provided to the D-flip-flop 32 and 3-bit shift register 33. That is, only when the down-count value reaches zero through the down-count operation of the 8-bit shift load register 31 and decrementer 34, the zero decision circuit 35 generates the reset pulse, and provides it to the D-flip-flop 32 and 3-bit shift register 33.

When a signal of a logic "0" value is supplied from the D-flip-flop 32, an AND gate 36 supplies the clock signal to the D-flip-flop 32 and 3-bit shift register 33, whereas it stops the supply of the clock signal when a signal of a logic "1" value is supplied form the D-flip-flop 32.

The 3-bit shift register 33 is comprised of three D-flip-flops that are shift-connected. When the clock signal is supplied via the AND gate 36, the 3-bit shift register 33 provides the signal that is serially supplied from the 8-bit shift load register 31 to the D-flip-flop 32, while shifting it by 3 bits at a timing of the clock signal. It should be appreciated that when the clock signal is not supplied from the AND gate 36, the 3-bit shift register 33 stops its shifting operation, wherein 3 bits of the signal stored in each D-flip-flop are supplied to the output buffer 37. The content held in these D-flip-flops is reset to all "0" when a reset pulse signal is supplied from the zero-decision circuit 35.

When a clock signal is supplied via the AND gate 36, the D-flip-flop 32 acquires the signal that is supplied serially from the 3-bit shift register 33 at a timing of the clock signal, and provides it to the 8-bit shift load register 31, zero-decision circuit 35, AND gate 36, and output buffers 37–39. It should be appreciated that the content held in the D-flip-flop 32 is reset to "0" when a reset pulse signal is provided from the zero-decision circuit 35.

Only during a period where the a signal of a logic "1" value is supplied from the D-flip-flop 32, the output buffer 37 provides as the Scan Mode Type information signal the 3-bit signal supplied from the 3-bit shift register 33. Only during a period where a signal of a logic "1" value is supplied from the D-flip-flop 32, the output buffer 38 provides the scan message signal a as the Scan-In Data signal to the input terminal SIN of the respective circuit blocks 101–103 shown in FIG. 7. Only during a period where a signal of a logic "1" value is supplied from the D-flip-flop 32, the output buffer 39 provides the clock signal as the test clock signal to the input terminal SCLK of the respective circuit blocks 101–103.

As described above, the message separation circuit 302 configured as shown in FIG. 9, which consists of the 8-bit shift load register 31, 3-bit shift register 33 and D-flip-flop 32, acquires bits 0–11 of the scan message signal a shown in FIG. 6, while shifting them sequentially. During this process, once the start bit ST of a logic "1" value is fed into the D-flip-flop 32, the supply of the clock signal from the AND gate 36 is stopped, thereby deactivating the shifting operation of the 3-bit shift register 33 and D-flip-flop 32. Thus, at that point in time, the content stored in the 3-bit shift register 33 comprises bits 1–3 of the scan message signal a shown in FIG. 6, i.e., the Scan Mode Type information; on the other hand, the content stored in the 8-bit shift load register 31 comprises bits 4–11 of the scan message signal a shown in FIG. 6, i.e., the Number of Clock Cycles information. Furthermore, the 8-bit shift load register 31 and decrementer 34 switch from their 8-bit shift register function to their 8-bit down-counter function, so that they initiates down-count operation with the clock cycles indicated by the Number of Clock Cycles information as their initial value. When the count value reaches 0 due to this down-count operation, the content of the 3-bit shift register 33 and D-flip-flop 32 is reset to 0.

In other words, over a period from the acquisition of the start bit ST of a logic "1" value into the D-flip-flop 32 to the supply of the clock signal corresponding to the clock cycles indicated by the Number of Clock Cycles information, the D-flip-flop 32 continues to supply a signal of a logic "1" value to the respective output buffers 37–39. Thus, only during that period, the Scan Mode Type information signal stored in the 3-bit shift register 33 is provided via the output buffer 37 to the mode decoder 303. Additionally, because the output buffer 38 is in its output enable state only during that period, the information after bit 12 in the scan message signal a shown in FIG. 6, that is, the Scan-In Data, is provided via the output buffer 38 to the input terminal SIN of the respective circuit blocks 101–103. Furthermore, because the output buffer 39 is in its output enable state only during that period, the test clock signal corresponding to the clock cycles indicated by the Number of Clock Cycles information is supplied to the input terminal SCLK of the respective circuit blocks 101–103.

The mode decoder 303 decodes, in response to the Scan Mode Type information signal supplied from the message separation circuit 302, i.e., scan message bits 1–3 shown in FIG. 6, the scan test mode to be performed and the respective circuit blocks to be scanned, and outputs an output control signal corresponding to the decoding, as well as enable signals 1–3.

FIG. 10 shows one example of truth table describing the operation of the mode decoder 303.

The output control signal outputted from the mode decoder 303 is supplied to the output control terminal of the bi-directional buffer 301. On the other hand, an enable signal 1 outputted from the mode decoder 303 is supplied to the input terminal SEN of the circuit block 101 shown in FIG. 7. An enable signal 2 outputted from the mode decoder 303 is supplied to the input terminal SEN of the circuit block 102. An enable signal 3 outputted from the mode decoder 303 is supplied to the input terminal SEN of the circuit block 103.

The scan-out signals 1–3 outputted from the output terminal SOUT of the respective circuit blocks 101–103 shown in FIG. 7 are supplied to an OR circuit 305 of the scan test controller 300 shown in FIG. 8.

The OR circuit 305 provides the OR output of the scan-out signals 1–3 as the scan message signal b described above to the output-signal input terminal of the bi-directional buffer 301.

When an output control signal of a logic "0" value is supplied from the mode decoder 303, the bi-directional buffer 301 takes in the scan message signal a inputted via the scan test bi-directional package pin 201 shown in FIG. 7, and supplies it to the message separation circuit 302, whereas when an output control signal of a logic "1" value is supplied from the mode decoder 303, it outputs, via the scan test bi-directional package pin 201 shown in FIG. 7, the scan message signal b supplied from the OR circuit 305.

Now, one example of scan test operation performed with the configuration shown in FIGS. 5–10 is described.

It is assumed here that of the circuit blocks 101–103 shown in FIG. 7, a scan test is conducted only on the circuit block 101, wherein the circuit block 101 is configured similarly to that shown in FIG. 1.

Figure 11:
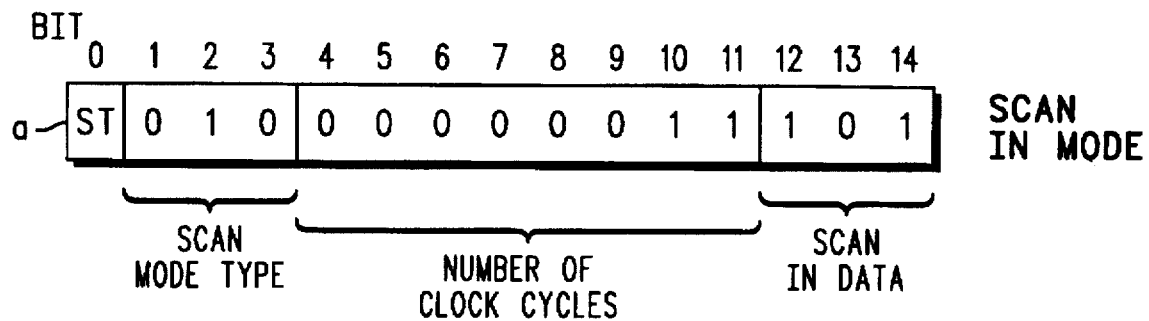
FIG. 11 shows one example of scan message signal a for implementing the scan-in mode.

First, the LSI tester 250' sends the scan message signal a shown in FIG. 11 serially to the LSI 200' in the order of bits 0–14, when performing the Scan-in mode on the circuit block 101 in the LSI 200'.

During this process, the scan message signal a is supplied to the message separation circuit 302 via the scan test bi-directional package pin 201 disposed in the LSI 20' and bi-directional buffer 301. The message separation circuit 302 extracts "0, 1, 0" in the message bits 1–3 of the scan message signal a shown in FIG. 11, in response to the header bit 0 of a logic "1" value in the scan message signal a, and provides it as the Scan Mode Type information signal to the mode decoder 303.

The mode decoder 303 provides an output as shown in FIG. 10 in response to the Scan Mode Type information signal consisting of "0, 1, 0". That is, the mode decoder 303 supplies the enable signal 1 of a logic "1" value to the input terminal SEN of the circuit block 101, while providing the enable signals 2 and 3 of a logic "0" value to the input terminal SEN of the respective circuit blocks 102 and 103. In response to such operation, only for the circuit block 101 of the circuit blocks 101–103, its scan latches SF1–SF3 formed therein yield a shift register configuration, i.e., a scan path.

The message separation circuit 302 extracts "0, 0, 0, 0, 0, 0, 1, 1" in the message bits 4–11 of the scan message signal a shown in FIG. 11, and generates a test clock signal corresponding to the clock cycles designated in the Number of Clock Cycles information extracted, i.e., three clocks, to supply it to the input terminal SCLK of the respective circuit blocks 101–103. The Number of Clock Cycles in the scan-in mode corresponds to the number of scan latch stages that exist in the component circuits. Concurrent with the supply of such a test clock signal, the message separation circuit 302 uses "1, 0, 1" in the message bits 12–14 of the scan message signal a shown in FIG. 11 as scan-in data, and serially supplies them to the input terminal SIN of the circuit block 101. In response to such operation, each of the scan latches SF1–SF3 formed in the circuit block 101 stores and holds the scan-in data consisting of "1, 0, 1", while shifting it at each timing of the supply clock signal. During this process, because the number of clock cycles of the supply clock signal is 3, signals of a logic "1" value, a logic "0" value, and a logic "1" value are eventually stored and hold in the scan latches SF1, SF2, and SF3, respectively (Scan-In Mode).

Figure 12:
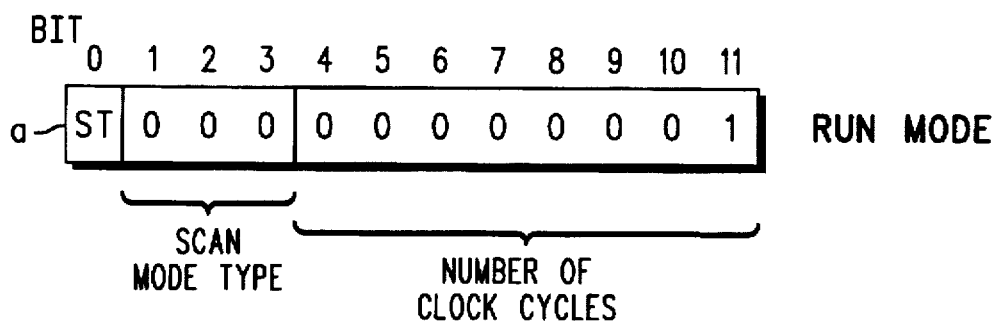
FIG. 12 shows one example of scan message signal a for implementing the RUN mode.

Next, the LSI tester 250' serially sends the scan message signal a shown in FIG. 12 to the LSI 200', when performing a RUN mode on the circuit block 101 in the LSI 200'.

Figure 2:
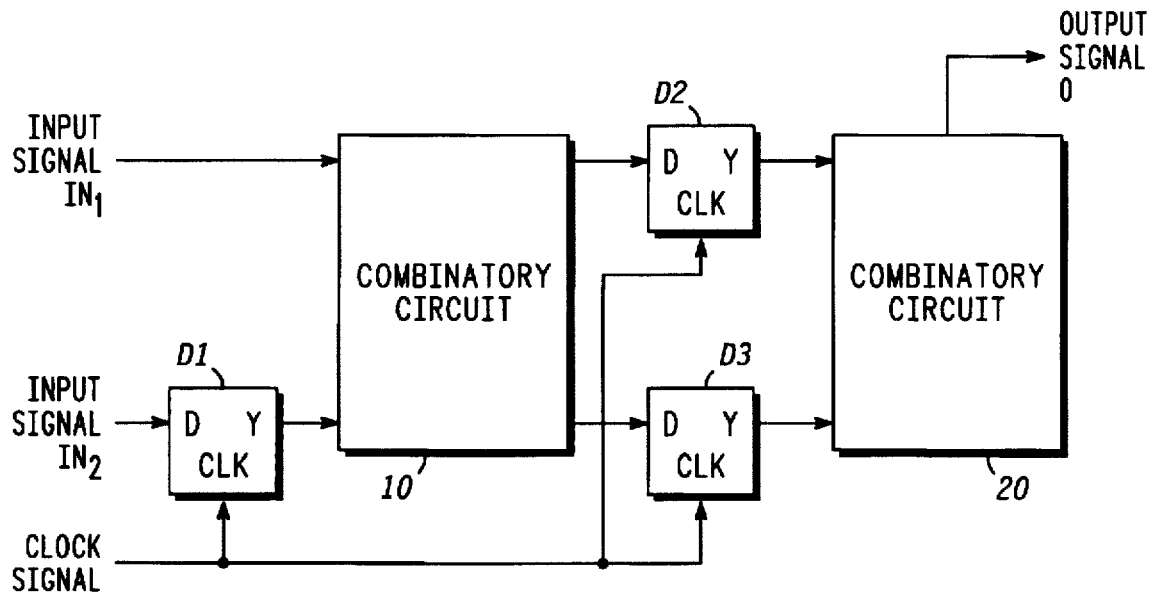
FIG. 2 shows one example of circuit block formed in a semiconductor integrated circuit device.

During this process, in response to the header bit 0 of a logic "1" value in the scan message signal a, the message separation circuit 302 extracts message bits 1–3 of the scan message signal a shown in FIG. 12, i.e., "0, 0, 0", and supplies them as the Scan Mode Type information signal to the mode decoder 303. The mode decoder 303 provides an output as shown in FIG. 10 in response to the supply of the Scan Mode Type information signal, such as "0, 0, 0". That is, the mode decoder 303 supplies enable signals 1–3 of a logic "0" value to the input terminal SEN of the respective circuit blocks 101–103. In response to such operation, all the scan latches contained in the circuit blocks 101–103 form their inherent D-latch configuration. In other words, for the circuit block 101, where its scan latches SF1–SF3 formed therein are of shift register configuration in the Scan-In mode, its shift register configuration is reset to form a circuit having the same function as the configuration that ought to be as shown in FIG. 2. The message separation circuit 302 extracts "0, 0, 0, 0, 0, 0, 0, 1" in the message bits 4–11 of the scan message signal a shown in FIG. 12, and generates a test clock signal corresponding to the clock cycles designated in the Number of Clock Cycles extracted, i.e., one clock, to provide it to the input terminal SCLK of the respective circuit blocks 101–103. During this process, as a result of the performance of the Scan-In mode, signals of a logic "1" value, a logic "0" value, and a logic "1" value are stored and held in the scan latches SF1, SF2, and SF3, respectively. That is, in response to such operation, the circuit block 101 performs circuit operation for one clock, with the states stored and held in the scan latches SF1–SF3 as its initial state (RUN mode).

Figure 13:
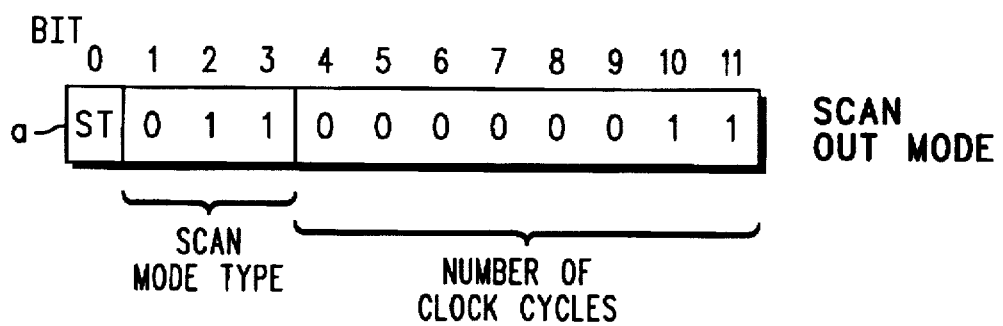
FIG. 13 shows one example of scan message signal a for implementing the scan-out mode.
Figure 13:
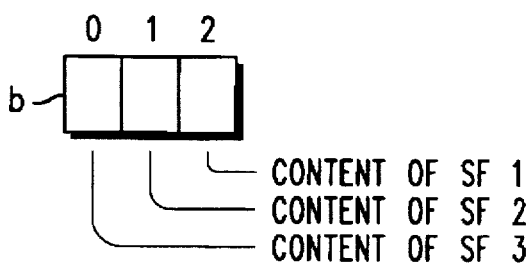

Next, the LSI tester 250' serially sends the scan message signal a shown in FIG. 13 to the LSI 200', when performing the Scan-Out mode on the circuit block 101 in the LSI 200'.

During this process, the message separation circuit 202 in the scan test circuit 300 extracts message bits 1–3 of the scan message signal a shown in FIG. 13, i.e., "0, 1, 1" and provides them as the Scan Mode Type information signal to the mode decoder 303. The mode decoder 303 provides an output as shown in FIG. 10, in response to the supply of the Scan Mode Type information such as "0, 1, 1". In other words, the mode decoder 303 provides an enable signal of a logic "1" value to the input terminal SNE of the circuit block 101, while supplying enable signals 2 and 3 of a logic "0" value to the input terminal SEN of the respective circuit blocks 102 and 103. In response to such operation, only for the circuit block 101 of the circuit blocks 101–103, its scan latches SF1–SF3 formed therein yield a shift register configuration, i.e., a scan path. Furthermore, the message separation circuit 302 extracts "0, 0, 0, 0, 0, 0, 1, 1" in the message bits 4–11 of the scan message signal a shown in FIG. 13, and generates a test clock signal corresponding to the clock cycles designated by the Number of Clock Cycles information, i.e., three clocks, to provide it to the input terminal SCLK of the respective circuit blocks 101–103. In response to such operation, the respective scan latches SF1–SF3 formed in the circuit block 101 send the content stored and held in response to the circuit operation performed in the RUN mode to the scan test controller 300 as a Scan-Out signal 1, while shifting it.

At the same time, the mode decoder 303 in the scan test controller 300 provides an output control signal of a logic "1" value to the output control terminal of the bi-directional buffer 301 in response to the supply of the Scan Mode Type information signal, such as "0, 1, 1" shown in FIG. 13. In response to such operation, the Scan-Out signal 1 sent from the circuit block 101 is sent as the scan message signal b shown in FIG. 13 to the LSI tester 250' via the OR circuit 305, bi-directional buffer 301, and the scan test bi-directional package pin 201 of the LSI 200' shown in FIG. 8 (Scan-Out Mode).

Then, the LSI tester 250' compares the scan-out signal supplied as the scan message signal b with a predetermined expected value, and, only if they mismatch, determines that the circuit block 101 is faulty.

BENEFIT OF THE INVENTION

As may be clear from the above description, the scan test circuit in the semiconductor IC device according to the present invention uses as a scan message signal a signal consisting of Scan Mode Type information that designates the scan mode to be performed, and Scan-In Data as fault diagnostic test data, connected to each other in series, to extract the Scan Mode Type information and Scan-In Data from the scan message signal. During this process, if the Scan Mode Type information is indicative of the scan-in mode, an enable signal is supplied to the relevant circuit block to allow the scan-in data to be held in the scan latches formed in that circuit block. On the other hand, if the Scan Mode Type information is indicative of the scan-out mode, an enable signal is supplied to the relevant circuit block to cause the content held in the respective scan latches formed in that circuit block to be scanned out, thereby outputting it as the scan message signal.

That is, with the scan test circuit, a one-bit bi-directional scan message signal is used to control not only scan mode setting but also input/output of both scan-in and scan-out data.

Thus, according to the present invention, only one package pin is required in a semiconductor IC device to perform scan tests, thereby advantageously eliminating the bottleneck imposed by the scan-path scheme in terms of the number of pins for the semiconductor IC device.

What is claimed is:

1. A scan test circuit in a semiconductor integrated circuit, comprising:

a circuit block having a scan latch for shifting a scan-in signal and holding the scan-in signal at each clock timing in response to an enable signal, the scan latch shifting the hold signal and outputting the hold signal as scan-out at the clock timing in response to the enable signal, the scan test circuit further comprising:

scan message input and output means for receiving a scan message signal including scan mode type information and scan-in data connected to each other in series, and for transmitting the scan-out signal as the scan message signal in response to an output control signal, the scan mode type information signal being operative to designate a scan mode, and the scan-in data serving as a fault diagnostic test data;

message separating means for separating the scan mode type information from the scan message signal, and for separating the scan-in data as the scan-in signal from the scan message signal; and a mode decoder for supplying the enable signal to the circuit block when the scan mode type information is indicative of a scan-in mode, and for supplying the enable signal to the circuit block and supplying the output control signal to the scan message input and output means when the scan mode type information is indicative of a scan-out mode.

2. A scan test circuit in a semiconductor integrated circuit according to claim 1, wherein the scan message signal includes a clock information being indicative of the number of clock cycles of the clock signal, and wherein the message separating means supplies to the scan latch the clock signal for clock cycles corresponding to the clock information.

* * * * *